United States Patent
Kobori et al.

(10) Patent No.: US 8,363,410 B2
(45) Date of Patent: Jan. 29, 2013

(54) ELECTRIC CONNECTING APPARATUS

(75) Inventors: Eiji Kobori, Tokyo (JP); Takeyuki Suzuki, Yokohama (JP)

(73) Assignee: Yamaichi Electronics Co., Ltd., Tokyo (JP)

( * ) Notice: Subject to any disclaimer, the term of this patent is extended or adjusted under 35 U.S.C. 154(b) by 114 days.

(21) Appl. No.: 12/862,364

(22) Filed: Aug. 24, 2010

(65) Prior Publication Data

US 2011/0058338 A1 Mar. 10, 2011

(30) Foreign Application Priority Data

Sep. 8, 2009 (JP) ................................. 2009-207042

(51) Int. Cl.
*H05K 7/20* (2006.01)

(52) U.S. Cl. ............... 361/719; 361/679.46; 361/679.54; 361/704; 361/714; 361/721; 165/80.3; 165/104.33; 165/185; 439/73; 439/487

(58) Field of Classification Search ............. 361/679.46, 361/679.54, 704, 715, 719, 717, 718; 165/80.3, 165/104.33, 185; 174/16.3, 252; 439/65–73, 439/330, 331, 263, 485, 487, 337; 324/760, 324/765
See application file for complete search history.

(56) References Cited

U.S. PATENT DOCUMENTS

| | | | | |
|---|---|---|---|---|
| 4,082,407 A | * | 4/1978 | Smorzaniuk et al. | 439/487 |
| 4,573,103 A | * | 2/1986 | Nilsson | 361/721 |
| 5,677,247 A | * | 10/1997 | Hundt et al. | 438/107 |
| 5,807,104 A | * | 9/1998 | Ikeya et al. | 439/73 |
| 5,923,179 A | * | 7/1999 | Taylor | 324/750.1 |
| 6,323,665 B1 | * | 11/2001 | Johnson et al. | 324/750.07 |
| 6,602,091 B2 | * | 8/2003 | Belady et al. | 439/485 |
| 6,740,820 B2 | * | 5/2004 | Cheng | 174/260 |
| 6,752,645 B2 | | 6/2004 | Nakamura et al. | |
| 7,476,108 B2 | * | 1/2009 | Swain et al. | 439/79 |
| 7,601,009 B2 | * | 10/2009 | Di Stefano | 439/73 |
| 7,833,023 B2 | * | 11/2010 | Di Stefano | 439/73 |
| 2007/0269999 A1 | * | 11/2007 | Di Stefano | 439/73 |
| 2007/0281506 A1 | * | 12/2007 | Wang et al. | 439/70 |

FOREIGN PATENT DOCUMENTS

| | | |
|---|---|---|
| JP | 63-101481 | 7/1988 |
| JP | 64-43580 | 3/1989 |
| JP | 2003-59602 | 2/2003 |

* cited by examiner

*Primary Examiner* — Michail V Datskovskiy
(74) *Attorney, Agent, or Firm* — Finnegan, Henderson, Farabow, Garrett & Dunner, LLP (57) ABSTRACT

Provided is an electric connecting apparatus configured to dissipate heat generated from a contact itself via an insulating plate, a metallic enclosure, and a printed wiring board. The electric connecting apparatus includes at least a housing configured to accommodate multiple contacts. At least part of the housing is made of a material having high heat conductivity. The multiple contacts are arranged linearly in at least one row. The multiple contacts are in abutting contact with the at least part of the housing via at least an insulating member made of an electrically insulative material having high heat conductivity.

17 Claims, 8 Drawing Sheets

ELECTRIC CONNECTING APPARATUS

CROSS-REFERENCE TO RELATED APPLICATIONS

This application claims the benefit of Japanese Patent Application No. 2009-207042, filed Sep. 8, 2009, which is hereby incorporated by reference herein in its entirety.

BACKGROUND OF THE INVENTION

1. Field of the Invention

The present invention relates to an electric connecting apparatus for electrically connecting a semiconductor device and a printed wiring board, or more specifically to a heat dissipation mechanism of a contact constituting the electric connecting apparatus.

2. Description of the Related Art

An electric connecting apparatus configured to electrically connect a semiconductor device such as an integrated circuit package to a printed wiring board has had the following problem along with the complication of the configurations of semiconductor devices. When current flows through a semiconductor device having such complicated configuration, an increasing amount of heat is generated from the semiconductor device. As measures for such heat generation from the semiconductor device, a heat dissipation mechanism for dissipating heat generated in a semiconductor device has been studied in the field of electric connecting apparatuses. A conventional heat dissipation mechanism in an electric connecting apparatus is configured to dissipate heat to outside air surrounding the electric connecting apparatus by utilizing a heat sink or a dissipation fin, as disclosed n Japanese Patent Laid-Open No. 2003-059602.

On the other hand, since a large current is never applied to a contact itself that constitutes the electric connecting apparatus, heat generation from the contact itself has heretofore not been regarded as a problem. Nevertheless, the heat generation from the contact itself has to be taken into consideration as a large current is more often carried between a semiconductor device and a printed wiring board. This is because the heat generation from the contact itself may adversely affect an enclosure or components disposed around the contact. For example, consider a case where the contact increases its temperature due to the heat generation by itself up to a temperature exceeding a heatproof temperature of a contact holding plate which is configured to hold the contact and which is made of synthetic resin. In this case, it may become impossible for the contact holding plate to hold the contact.

An object of the present invention is to provide an electric connecting apparatus configured to dissipate heat generated from a contact itself via any of an insulating plate, a housing at least partially made of a material having high heat conductivity, and a set of the housing and a printed wiring board on which the housing is mounted.

SUMMARY OF THE INVENTION

To achieve the above object, an electric connecting apparatus according to the present invention is provided with at least a housing to accommodate a plurality of contacts. In the electric connecting apparatus, at least part of the housing is made of a material having high heat conductivity, the plurality of contacts are arranged linearly in at least one row, and the plurality of contacts are in abutting contact with the at least part of the housing via at least one insulating member made of an electrically insulative material having high heat conductivity.

Moreover, it is preferable that the at least part of the housing constituting the electric connecting apparatus is made of any of metallic materials including aluminum, an alloy containing aluminum, copper, an alloy containing copper, and stainless steel.

Furthermore, it is preferable that the insulating member is made of a material having higher heat conductivity than a material of the at least part of the housing does. Specifically, it is preferable that the insulating member is made of any of polycrystalline diamond or ceramics.

In the electric connecting apparatus according to the present invention, at least part of the housing that constitutes the electric connecting device is made of a material having high heat conductivity and the multiple contacts are arranged linearly in at least one row. Meanwhile, the multiple contacts are configured to come into abutting contact with the housing via at least an insulating member made of an electrically insulative material having high heat conductivity. Therefore, heat generated from each contact itself is dissipated effectively via the housing or via the housing and a printed wiring board on which the housing is mounted. In this way, it is possible to suppress an increase in temperature of the electric connecting device and thereby to prevent damages of components constituting the electric connecting apparatus.

Moreover, making an insulating plate of a material having high heat conductivity and simplifying a structure of the insulating plate enhance workability, thereby suppressing an increase in manufacturing cost of the electric connecting apparatus.

Further features of the present invention will become apparent from the following description of exemplary embodiments with reference to the attached drawings.

BRIEF DESCRIPTION OF THE DRAWINGS

FIGS. 8A and 8B show an electric connecting apparatus according to another embodiment of the present invention.

DESCRIPTION OF THE EMBODIMENTS

Now, preferred embodiments of the present invention will be described below with reference to FIG. 1 to FIG. 8B.

(First Embodiment)

FIG. 1 to FIG. 5 show an electric connecting apparatus according to a first embodiment of the present invention. The electric connecting apparatus according to the first embodiment is shown as an IC socket of a clam shell type. Note that the electric connecting apparatus is not limited only to the one of the clam shell type but may also be the one of an open top type. The electric connecting apparatus according to this embodiment generally includes a cover member 10, a housing 40, and multiple contacts 80. For example, the electric connecting apparatus is mounted on a printed wiring board 90 such as a test board of a test instrument for testing a semiconductor device 95 (see FIG. 3). The semiconductor device 95 mounted on the electric connecting apparatus is electrically connected to the printed wiring board 90 via the contacts 80. In this embodiment, the semiconductor device 95 to be mounted is an integrated circuit package (hereinafter also referred to as an "IC package") including leads 97 which are drawn out of each of two side faces of a package body 96 and are formed into a gull-wing shape (L-shape). However, the configuration of the semiconductor device 95 is not limited only to the foregoing.

The cover member 10 is made of engineering plastics such as polyetherimide (PEI), is formed substantially into a rectangular shape when viewed from above, and constitutes a shell of the electric connecting apparatus together with the housing 40 to be described later. The cover member 10 is turnably connected to the housing 40 via a hinge mechanism 20.

Figure 2:
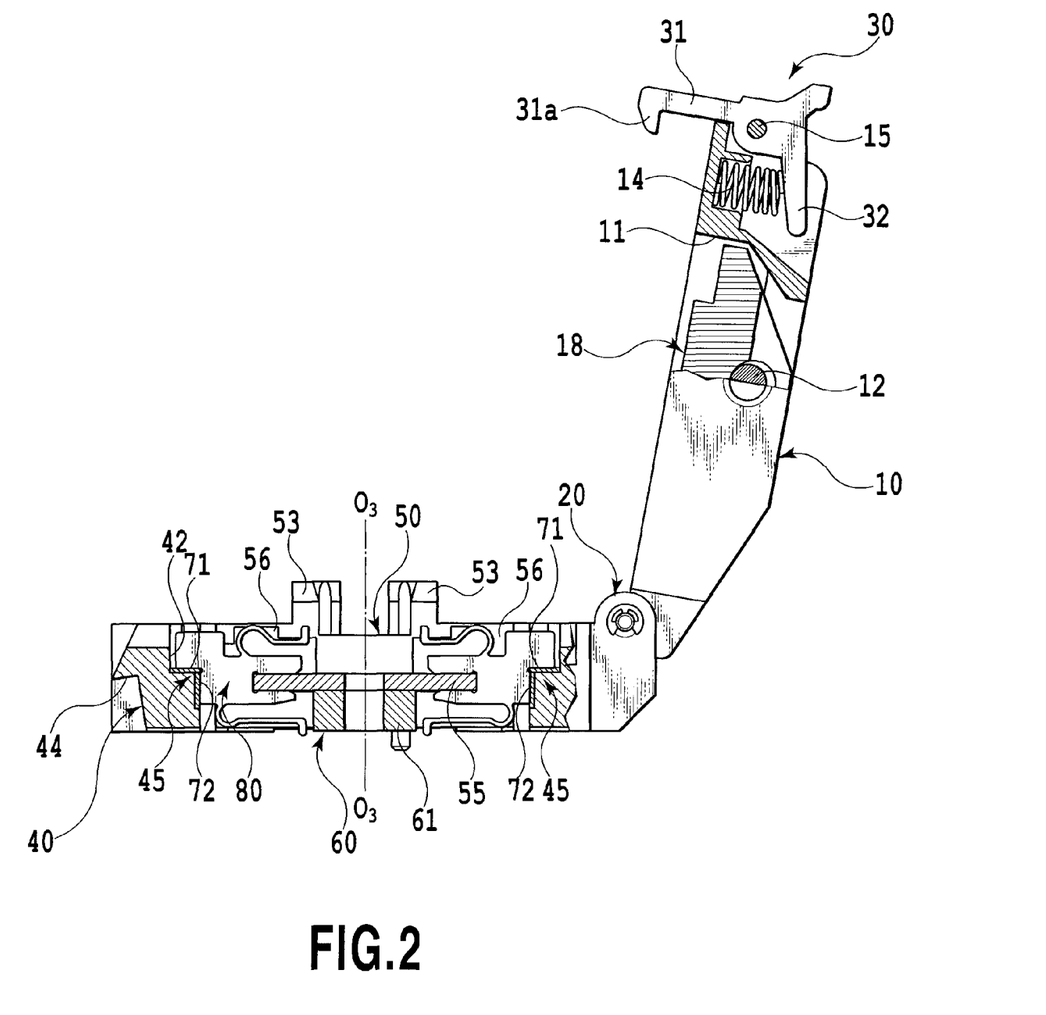
FIG. 2 is a partially sectioned side view of the electric connecting apparatus of FIG. 1 in a state where a semiconductor device is not attached thereto and a cover is open.

As shown in FIG. 2, the cover member 10 has a recessed portion 11 for accommodating a pusher 18. The recessed portion 11 is formed in a central portion on a side that faces the housing 40 (on a backside).

Figure 3:
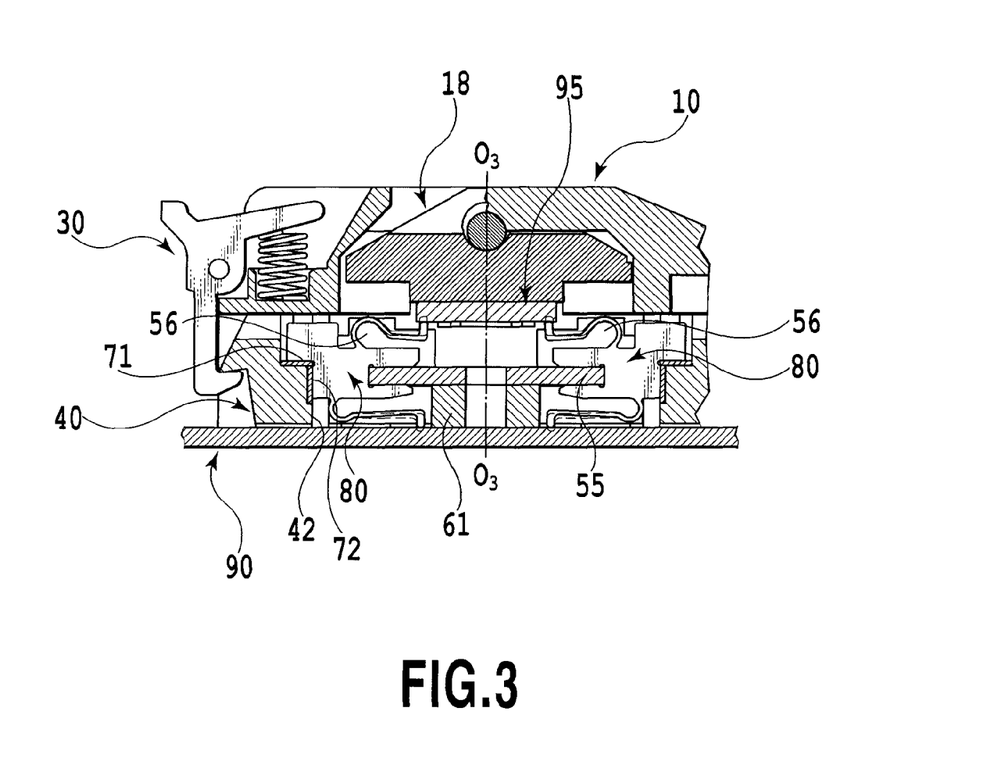
FIG. 3 is a partially sectioned side view of the electric connecting apparatus of FIG. 1 in a state where the semiconductor device is attached thereto and the cover is closed.

As shown in FIG. 3, the pusher 18 has a function to push the mounted semiconductor device 95 downward when the cover member 10 is closed on the housing 40. This pushing operation of the pusher 18 allows the multiple leads 97 of the semiconductor device 95 to come into contact with the corresponding contacts 80 respectively at predetermined contact pressure. The pusher 18 is accommodated in the recessed portion 11 and swingably attached to the cover member 10 via a first shaft 12. The pusher 18 is made of engineering plastics such as polyethersulfone (PES), but the material thereof is not limited thereto. The pusher 18 is formed substantially into a rectangular shape when viewed from above. A side of the pusher 18 which comes into contact with the semiconductor device 95 is preferably formed flat.

A latch member 30 is provided on one side of an outer periphery, which includes four sides to define the rectangular shape of the cover member 10, the side located opposite of a side to which the hinge mechanism 20 is provided. The latch member 30 is turnably attached to the cover member 10 via a second shaft 15.

As shown in FIG. 3, the latch member 30 is the member having a function to keep the cover member 10 being closed on the housing 40 (in other words, to keep the cover member 10 pushing the semiconductor device 95 downward to the housing 40 via the pusher 18). The latch member 30 includes a first lever 31 and a second lever 32 which are substantially perpendicular to each other. The first lever 31 has a claw 31a on its tip end. When the cover 40 is closed, the claw 31a is engaged with a locking part 44 formed on the housing 40. The second lever 32 is in contact with a coil spring 14 located in a space between the second lever 32 and the cover member 10 and is biased counterclockwise in FIG. 2.

The housing 40 is made of a metallic material such as aluminum (or an alloy thereof), copper (or an alloy thereof) or stainless steel. The housing 40 is formed substantially into a rectangular shape when viewed from above and constitutes the shell of the electric connecting apparatus together with the cover member 10 as described previously. The housing 40 is fixed onto the printed wiring board 90 by way of a fixture such as a screw. Here, the housing 40 may be formed of a synthetic resin material containing the above-described metallic material.

Figure 1:
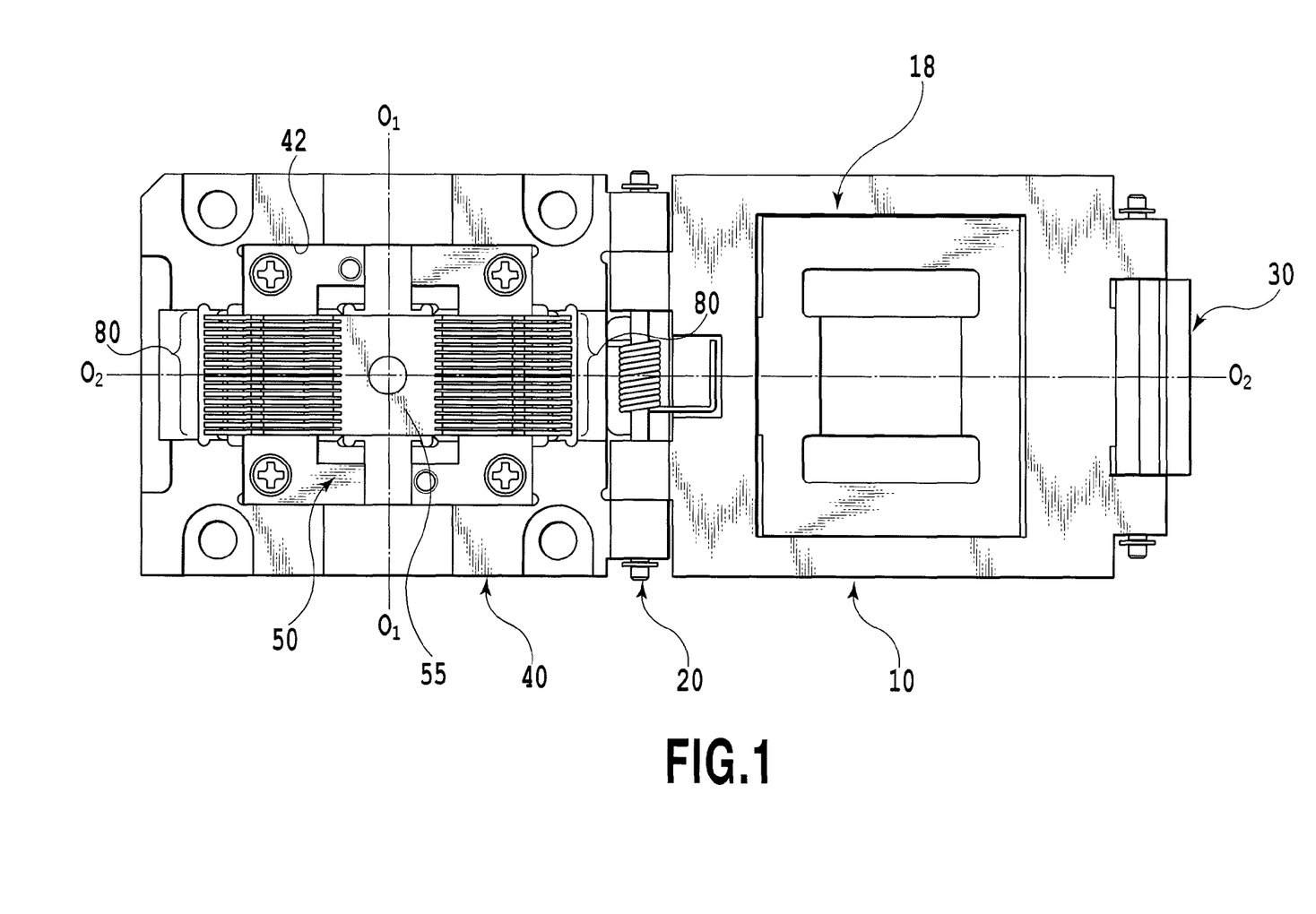
FIG. 1 is a plan view of an electric connecting apparatus according to a first embodiment of the present invention.

In this embodiment, the housing 40 has a contact accommodation space 42 formed in its central portion. The contact accommodation space 42 is provided for accommodating a first contact holding member 50 and a second contact holding member 60, which are described later, and the multiple contacts 80 to be held by the first and second holding members 50 and 60. The contact accommodation space 42 is formed substantially into a rectangular shape when viewed from above. The contact accommodation space 42 has fixing portions 43 (see FIG. 4) on its four corners. The first contact holding member 50 is to be fixed to the fixing portions 43. The contact accommodation space 42, except the fixing portions 43, penetrates the housing 40. In FIG. 1, the contact accommodation space 42 is formed symmetrically on either side of a first horizontal center line $O_1$-$O_1$. Here, the first horizontal center line $O_1$-$O_1$ (FIG. 1) of the contact accommodation space 42 is a center line which extends in the horizontal direction of the contact accommodation space 42 and which is parallel to a side of the housing 40 to which the hinge mechanism 20 is provided. Meanwhile, a second horizontal center line $O_2$-$O_2$ (FIG. 1) is another center line which extends in the horizontal direction of the contact accommodation space 42 and which is perpendicular to the first horizontal center line $O_1$-$O_1$. The second horizontal center line $O_2$-$O_2$ serves as a center line of the housing 40 as well as of the cover member 10 which is turnable relative to the housing 40 by way of the hinge mechanism 20. A vertical center line $O_3$-$O_3$ (FIG. 2 and FIG. 3) is a center line extending in a vertical direction of the contact accommodation space 42 which is perpendicular to both of the first horizontal center line $O_1$-$O_1$ and the second horizontal center line $O_2$-$O_2$.

On inner walls of the contact accommodation space 42 opposed to each other, a pair of step portions 45 are arranged on the opposite sides of the first horizontal center line $O_1$-$O_1$. When the contacts 80 are accommodated in the contact accommodation space 42, cutout recessed portions 85 of the contacts 80 come into contact with the step portions 45. To be more precise, each step portion 45 is formed of a horizontal wall portion 45a and a vertical wall portion 45b, while the cutout recessed portion 85 of each contact 80 is formed of a horizontal abutting portion 85a and a vertical abutting portion 85b. The horizontal abutting portion 85a and the vertical abutting portion 85b are respectively brought into abutting contact with the corresponding horizontal wall portion 45a and the corresponding vertical wall portion 45b via a first insulating plate 71 and a second insulating plate 72 which are electrically insulative.

Each contact 80 is integrally formed by punching a metal thin plate such as a copper alloy. As clearly shown in FIGS. 4 and 5, each contact 80 includes a first elastically deformable portion 81, a contact main body portion 82, and a second elastically deformable portion 83.

The first elastically deformable portion 81 is located above the contact main body portion 82. A first contact point 81a which is electrically contactable with the corresponding one of the leads 97 of the semiconductor device 95 is formed on a tip end of the first elastically deformable portion 81. The second elastically deformable portion 83 is located below the contact main body portion 82. A second contact point 83a which is electrically contactable with a corresponding external contact point of the printed wiring board 90 is formed on a tip end of the second elastically deformable portion 83. Preferably, the first contact point 81a and the second contact point 83a are located in front of the contact main body portion 82 and are arranged substantially along a straight line extending in a vertical direction, although the configurations of the contact points 81a and 83a are not limited only to the foregoing. Specifically, as shown in FIG. 2 and FIG. 3, the two contact points 81a and 83a protrude from a front end of the contact main body portion 82 toward the vertical center line $O_3$-$O_3$.

An engagement recessed portion 84 to be engaged with a contact holding plate 55 of the first contact holding member 50 is formed at a front part of the contact main body portion 82. The cutout recessed portion 85 is formed at a rear part of the contact main body portion 82. The engagement recessed portion 84 is open forward and is formed into an elongated rectangular shape having a narrow width in the vertical direction when viewed sideways (when viewed along direction of an arrow A in FIG. 5) so as to correspond to a cross-sectional shape of the contact holding plate 55. The cutout recessed portion 85 is open backward and downward, and includes the horizontal abutting portion 85a and the vertical abutting portion 85b which are perpendicular to each other.

The contacts 80 are held by an assembly formed by integrating the first contact holding member 50 and the second contact holding member 60.

The first contact holding member 50 is made of any of engineering plastics such as, but not limited thereto, polyether ether ketone. The first contact holding member 50 includes a first side wall 51 and a second side wall 52 which are parallel to each other. When embedded in the contact accommodation space 42 as shown in FIG. 1, the first side wall 51 and the second side wall 52 are arranged on the opposite sides of the second horizontal center line $O_2$-$O_2$ of the contact accommodation space 42.

Positioning members 53 and 53 are provided on an upper surface of the first side wall 51. The positioning members 53 and 53 are arranged on the opposite sides of the first horizontal center line $O_1$-$O_1$ when embedded in the contact accommodation space 42. Similarly, positioning members 54 and 54 are provided on an upper surface of the second side wall 52. The positioning members 54 and 54 are arranged on the opposite sides of the first horizontal center line $O_1$-$O_1$ when embedded in the contact accommodation space 42. The semiconductor device 95 is guided to a predetermined position by the four positioning members 53, 53, 54, and 54. To be more precise, the four positioning members 53, 53, 54, and 54 guide the multiple leads 97 so that each of the multiple leads 97 is positioned on top of the corresponding one of the multiple contacts 80.

Figure 4:
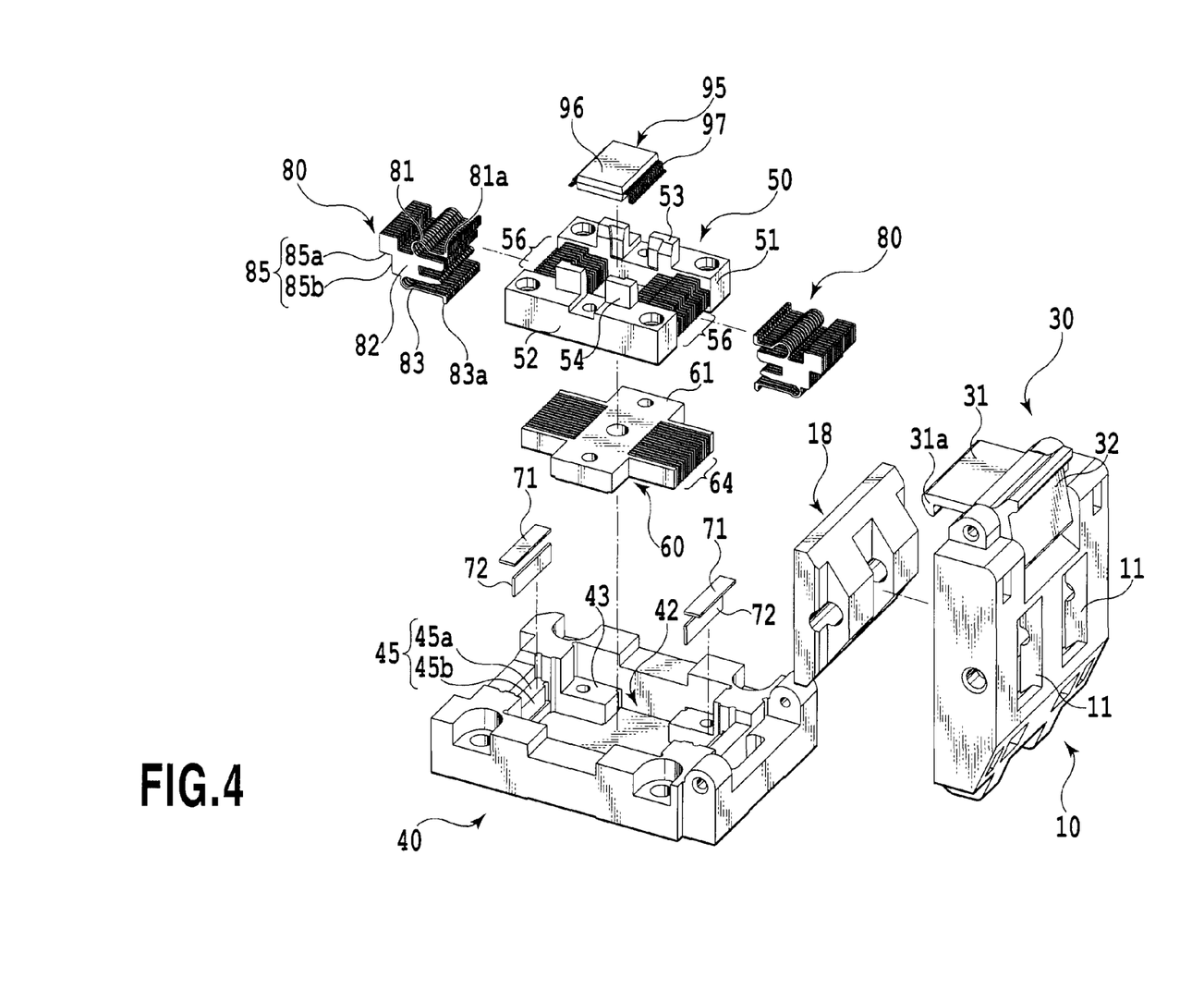
FIG. 4 is an exploded view of the electric connecting apparatus of FIG. 1.
Figure 5:
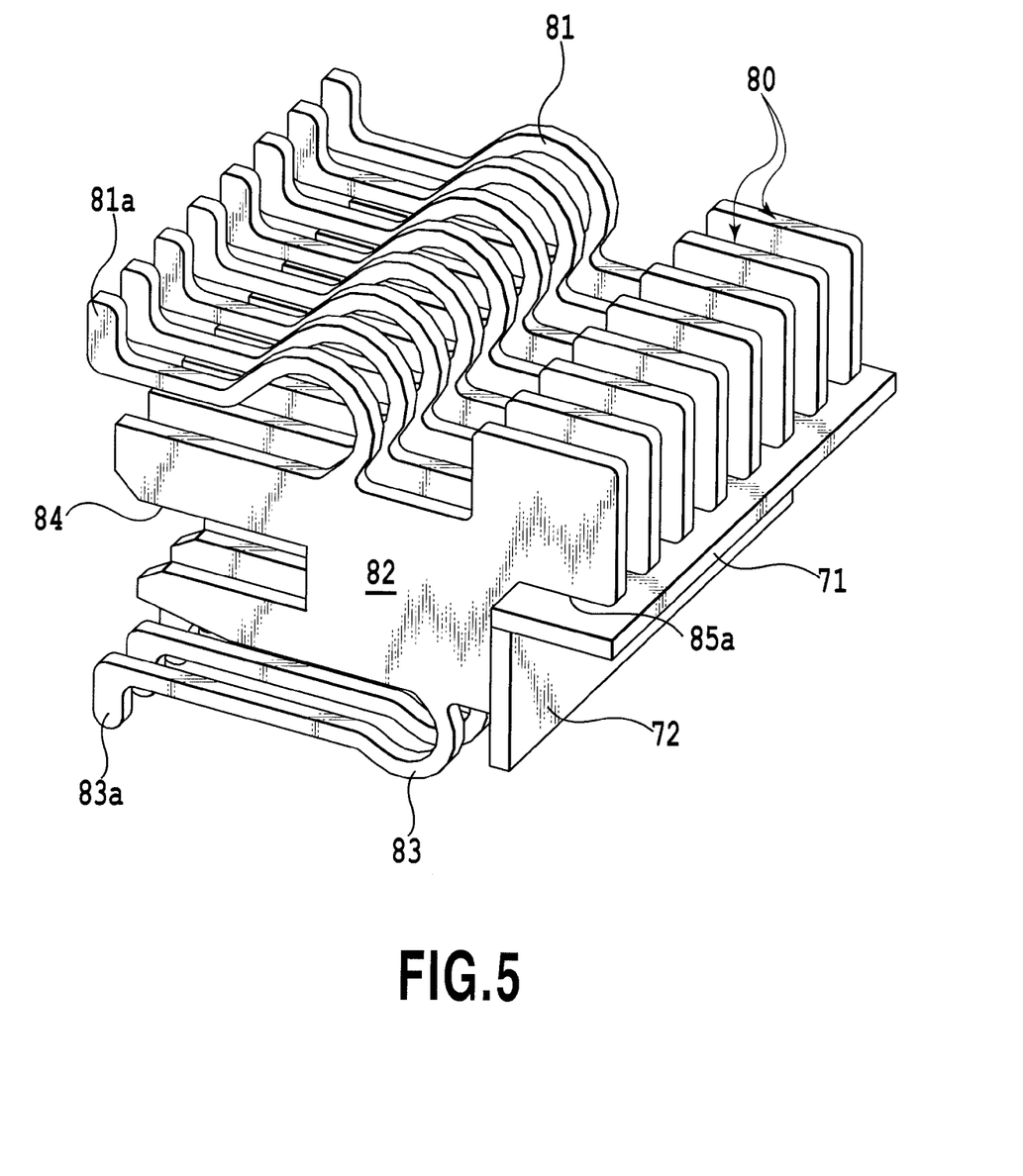
FIG. 5 is a partially enlarged view showing a relation between contacts and an insulating plate.

The first side wall 51 and the second side wall 52 are connected to each other by the single contact holding plate 55 having a symmetrical shape on either side of the first horizontal center line $O_1$-$O_1$ when embedded in the contact accommodation space 42. As shown in FIG. 2 and FIG. 3, both of right and left sides of the contact holding plate 55 are press-fitted into the engagement recessed portions 84 of the contacts 80 so as to hold the contacts 80. In this embodiment, as shown in FIG. 4 and FIG. 5, the multiple contacts 80 are arranged linearly in two rows on both of right and left sides of the contact holding plate 55 such that groups of the multiple contacts 80 arranged on the respective rows are opposed to each other. The contact holding plate 55 includes multiple partition plates 56 which are parallel to a plane defined by the second horizontal center line $O_2$-$O_2$ and the vertical center line $O_3$-$O_3$ when embedded in the contact accommodation space 42. Moreover, the multiple partition plates 56 are arranged on both of right and left sides of the contact holing plate 55 so that groups of the multiple partition plates 56 are arranged on the opposite sides of the first horizontal center line $O_1$-$O_1$. Each contact 80 is arranged between adjacent two of the partition plates 56. In other words, each partition plate 56 is arranged between adjacent two of the contacts 80 among the multiple contacts 80. Providing the partition plates 56 prevents electrical contact between the adjacent contacts 80.

The second contact holding member 60 is the member which is integrally fixed to a lower part of the first contact holding member 50 by use of a fixture such as a screw and which is configured to protect lower portions of the contacts 80 to be held by the holding plate 55 of the first contact holding member 50. The second contact holding member 60 is made of any of engineering plastics such as, but not limited thereto, polyether ether ketone as similar to the first contact holding member 50. The second contact holding member 60 includes a main body portion 61 and partition plates 64. The multiple partition plates 64 and 64 are formed on both of right and left sides of the main body portion 61. The multiple partition plates 64 and 64 are arranged at the same pitch as and have the same length as the multiple partition plates 56 provided on the contact holding plate 55 of the above-described first contact holding member 50. Accordingly, as similar to the multiple partition plates 56 and 56 of the first contact holding member 50, the multiple partition plates 64 arranged on both of right and left sides of the main body portion 61 are symmetrically arranged on either side of the first horizontal center line $O_1$-$O_1$ when embedded in the contact accommodation space 42.

The multiple contacts 80 held by the assembly formed by integrating the first contact holding member 50 and the second contact holding member 60 are accommodated in the contact accommodation space 42 and are fixed thereto by way of the fixing portions 43 by using fixtures such as screws. The multiple contacts 80 are arranged linearly in two rows at this time. Accordingly, a group of the cutout recessed portions 85 of the multiple contacts 80 on each row comes into abutting contact with the step portion 45 of the contact accommodation space 42 via the two insulating plates 71 and 72 which serve as insulating members. To be more precise, a group of the horizontal contact portions 85a of the cutout recessed portions 85 of the multiple contacts 80 in each row comes into abutting contact with the horizontal wall portion 45a of the step portion 45 via the first insulating plate 71 formed of a single plate. Similarly, a group of the vertical abutting portion 85b of the cutout recessed portions 85 of the multiple contacts 80 in each row comes into abutting contact with the vertical wall portion 45b of the step portion 45 via the second insulating plate 72 formed of a single plate. The contacts 80 come into abutting contact with the insulating plates 71 and 72 serving as the insulating members at multiple positions, at the horizontal abutting portions 85a and the vertical abutting portions 85b, thereby ensuring a large contact area with the insulating plates 71 and 72. In this way, it is possible to transfer heat generated from the contacts 80 efficiently to the housing 40.

The insulating plates 71 and 72 serving as the insulating members are made of an electrically insulative material such as polycrystalline diamond or ceramics. The insulating plates 71 and 72 are preferably made of a material having higher heat conductivity than a material of the contacts 80 does. In addition, the housing 40 is preferably made of a material having higher heat conductivity than a material of the insulating plates 71 and 72 does. In this embodiment, the insulating plate 71 or 72 is made of polycrystalline diamond and formed into the single plate shape as shown in FIG. 4 and FIG. 5. Incidentally, the material having high heat conductivity and the electrical insulation property tends to have poor machinability. Therefore, it is preferable to design the insulating plate 71 or 72 into a shape as simple as possible as described in this embodiment.

Although the first contact holding member 50 and the second contact holding member 60 are configured as separate members in this embodiment, these members may be formed into an integrated body if such forming is possible. Moreover, although the two insulating plates 71 and 72 serving as the insulating members are located respectively in two positions between the contacts 80 and the housing 40, only one of the two insulating plates 71 and 72 may be provided, or more insulating members may be provided besides the two insulating plates 71 and 72. Further, the two insulating plates 71 and 72 may be formed into an integrated body so as to have an L-shaped cross section, if such forming is possible.

The components to constitute the electric connecting apparatus have been described hereinabove. Now, an operation to mount the semiconductor device into the assembled electric connecting apparatus and a flow of the heat generated from the contacts thereof will be described below.

FIG. 2 shows the electric connecting apparatus with no semiconductor device 95 mounted thereon. The electric connecting apparatus is attached to the printed wiring board 90 (see FIG. 3) such as the test board. At this time, the second contact points 83a of the multiple contacts 80 are electrically in contact with the corresponding external contact points (not shown) of the printed wiring board 90 at a predetermined contact pressure. As shown in FIG. 2, the cover member 10 is released from engagement with the housing 40 by way of the latch member 30 and is turned clockwise by an action of a spring or the like provided in the hinge mechanism 20 so as to be opened. In this state, the semiconductor device 95 is carried from above onto the contacts 80 by means of the positioning members 53 and 54. The semiconductor device 95 is guided by the positioning members 53 and 54 such that the multiple leads 97 of the semiconductor device 95 come into contact with the corresponding first contact points 81a of the contacts 80. When the cover member 10 is turned counterclockwise from this state by way of the hinge mechanism 20, the pusher 18 comes into abutting contact with the semiconductor device 95. As the cover member 10 is turned more, the swingable pusher 18 pushes the semiconductor device 95 downward while maintaining the semiconductor device 95 substantially horizontal. When the cover member 10 completes turning, the claw 31a of the latch member 30 is engaged with the locking part 44 as shown in FIG. 3 to maintain the cover member 10 in the closed state. Here, the first contact points 81a of the contacts 80 are electrically in contact with the corresponding external contact points of the semiconductor device 95 at a predetermined pressure.

Figure 6:
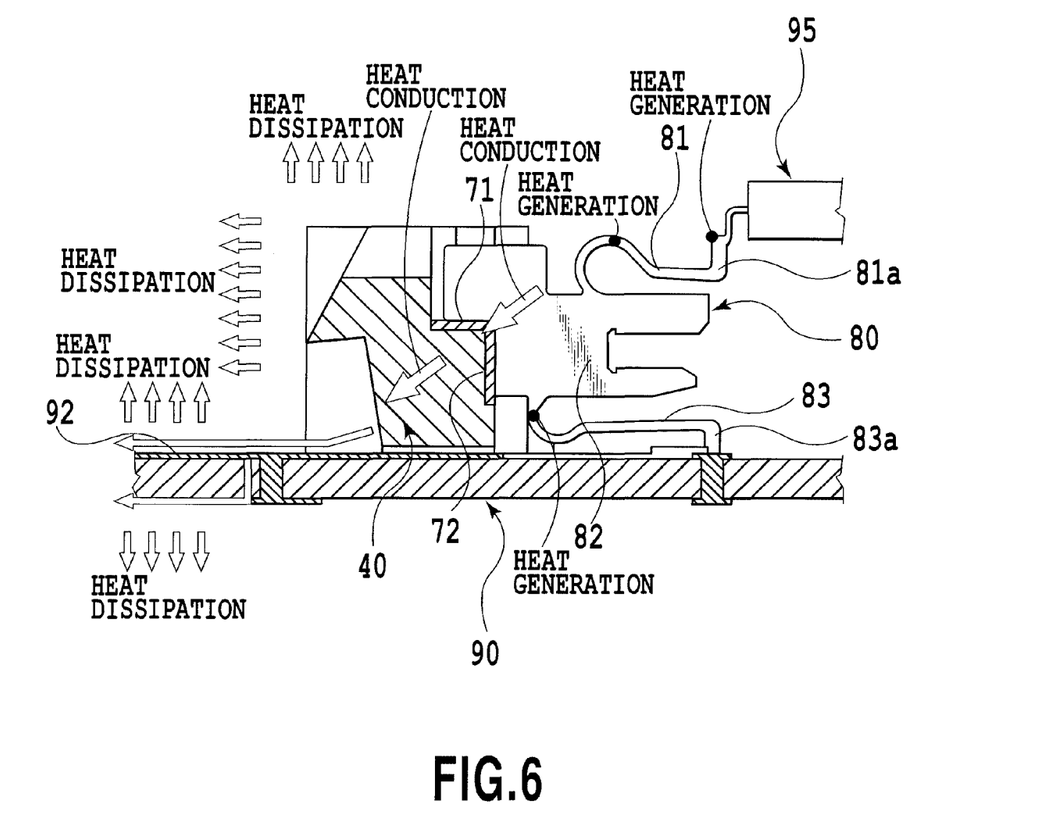
FIG. 6 is a cross-sectional view of a principal part of the electric connecting apparatus according to the present invention for explaining a mechanism for dissipating heat generated from the contacts.

In the state shown in FIG. 3, power is turned on and a current is applied to the printed wiring board 90 and the semiconductor device 95. The contacts 80 generate the heat when a large current is applied to the contacts 80. However, the generated heat flows through the housing 40 via the insulating plates 71 and 72 having high heat conductivity and is thus dissipated (see FIG. 6). Here, as shown in FIG. 6, it is also possible to provide a heat dissipation pad 92 to the printed wiring board 90. In this case, since the heat dissipation pad 92 comes into abutting contact with the housing 40, the heat flows through the printed wiring board 90 via the housing 40 and is then dissipated. That is, the electric connecting apparatus of the present invention dissipates the heat to a surrounding environment via the housing 40 or via the housing 40 and the printed wiring board 90 on which the housing 40 is attached.

Figure 7:
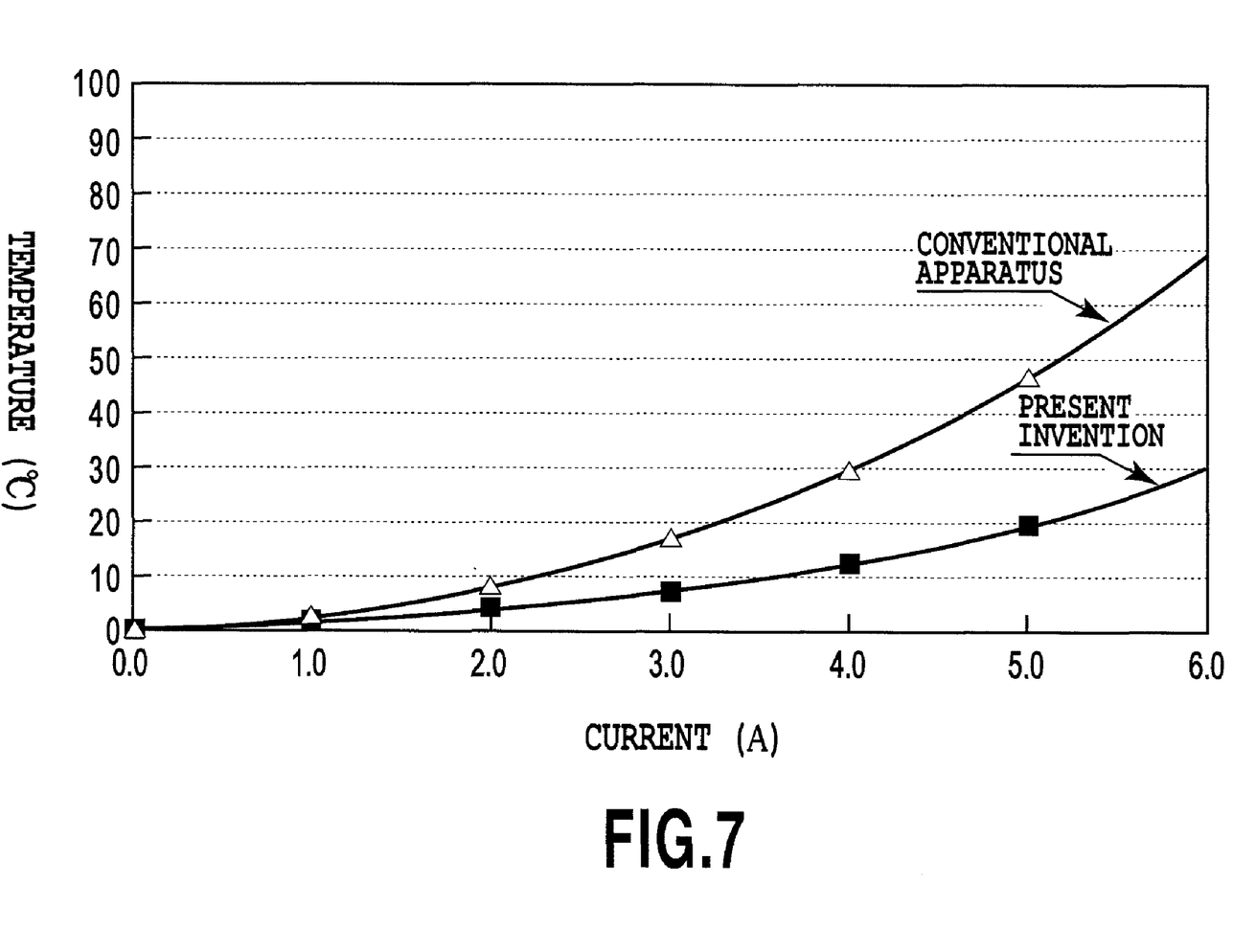
FIG. 7 is a graph showing increases in temperature attributable to heat generation of contacts in the case of the present invention and in the case of a conventional apparatus.

FIG. 7 is a graph showing increases in temperature in a conventional electric connecting apparatus and in the electric connecting apparatus according to the present invention. As understood from FIG. 7, when a current of 6 amperes flows through the contacts 80, the temperature of the conventional electric connecting apparatus rises up to about 70° C. whereas the increase in temperature of the electric connecting apparatus according to the present invention is suppressed to about 30° C. Specifically, it is apparent that the electric connecting apparatus according to the present invention is far more excellent in terms of dissipation effect than the conventional electric connecting apparatus. The increase in temperature of the electric connecting apparatus can be suppressed as described above. This can prevent the first contact holding member 50 and the second contact holding member 60 which hold the contacts 80 from weakening with the increase in temperature of the contacts 80, for example. Thereby, it is possible to avoid a situation where the contacts are held inadequately and thus electric contact between the semiconductor device 95 and the printed wiring board 90 becomes unstable and unreliable.

(Second Embodiment)

Figure 8A:
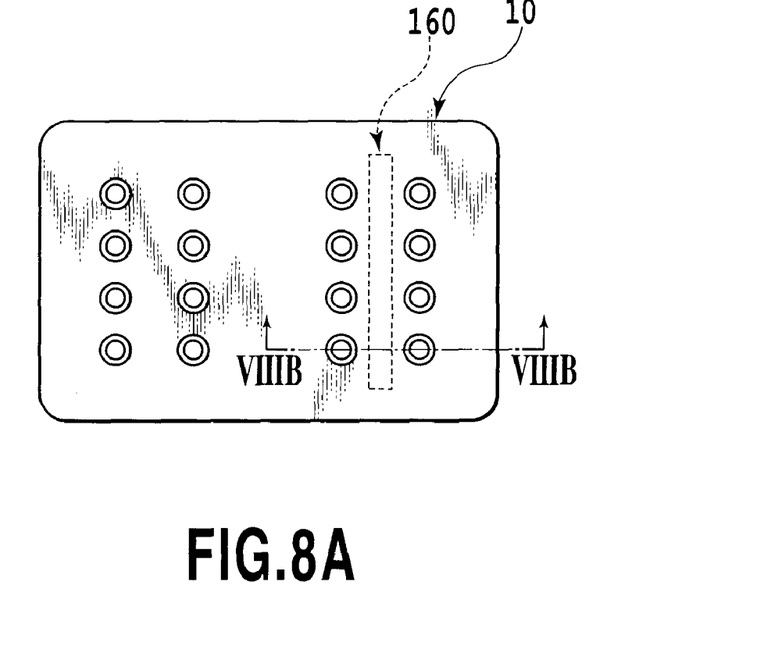
FIG. 8A is a top plan view and FIG. 8B is a side view showing a partial section taken along a VIIIB-VIIIB line in FIG. 8A.
Figure 8B:
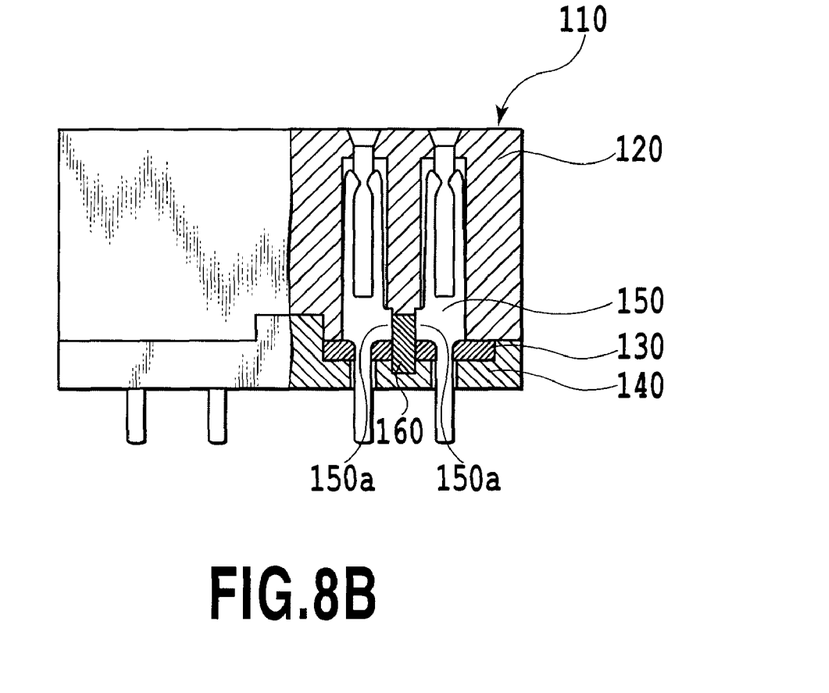

FIGS. 8A and 8B show an electric connecting apparatus according to a second embodiment of the present invention. The electric connecting apparatus according to the present embodiment is of a type in which multiple contacts are arranged in a matrix fashion.

FIGS. 8A and 8B show only a housing 110 of the electric connecting apparatus according to the present embodiment, which is configured to accommodate multiple contacts 150. The housing 110 essentially includes a main body portion 120 to accommodate the contacts 150, a contact holding member 130 made of synthetic resin being electrically insulative, a metallic base member 140, and the multiple contacts 150. As shown in FIG. 8A, the contacts 150 are arranged in a matrix fashion and the multiple contacts 150 are linearly arranged as in the case of the above-described first embodiment. Moreover, in the present embodiment, adjacent rows of the contacts 150 are arranged to be parallel to each other. Between the adjacent rows of the contacts 150 that are arranged parallel to each other, a plate-shaped insulating plate 160 is provided. The plate-shaped insulating plate 160 is made of a material having high heat conductivity such as polycrystalline diamond. In this embodiment, the contacts 150 are provided respectively with insulating plate abutting portions 150a at their lower parts to achieve abutting contact with the plate-shaped insulating plate 160. In this way, the plate-shaped insulating plate 160 can be in abutting contact with all predetermined portions of the respective multiple contacts 150 on the rows, which are adjacent to and parallel to each other. Meanwhile, as shown in FIG. 8B, the plate-shaped insulating plate 150 having high heat conductivity comes into contact with the metallic base member 140. Each of the multiple contacts 150 shown in the present embodiment is of a type configured to hold a pin that is drawn out of a semiconductor device, in a sandwiching manner. However, the contact is not limited only to this type. In other words, the multiple contacts 150 may be of any type as long as these contacts are arranged linearly and parallel to each other.

As similar to the above-described first embodiment, the electric connecting apparatus of the present embodiment can also suppress an increase in temperature of contacts attributable to the heat generated from the contacts themselves when a large current is applied thereto.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. An electric connecting apparatus provided with at least a housing to accommodate a plurality of contacts, wherein
   at least part of the housing is made of a material having high heat conductivity,
   the plurality of contacts are arranged linearly in at least one row,
   the plurality of contacts are in abutting contact with the at least part of the housing via at least one insulating member made of an electrically insulative material having high heat conductivity,
   a cutout recessed portion including a horizontal abutting portion and a vertical abutting portion is formed on each of the contacts, and
   the horizontal abutting portion and the vertical abutting portion come into abutting contact with the insulating member.

2. An electric connecting apparatus as claimed in claim 1, wherein
   the insulating member is made of a material having higher heat conductivity than a material of the contacts does.

3. An electric connecting apparatus as claimed in claim 1, wherein
   the at least part of the housing is made of metallic materials including at least one of aluminum, an alloy containing aluminum, copper, an alloy containing copper, and stainless steel.

4. An electric connecting apparatus as claimed in claim 1, wherein
   the insulating member is made of polycrystalline diamond or ceramics.

5. A test system for testing a semiconductor device, comprising:
   an electric connecting apparatus as claimed in claim 1; and
   a printed wiring board including a heat dissipation pad which comes into abutting contact with the housing of the electric connecting apparatus.

6. An electric connecting apparatus as claimed in claim 1, wherein
   the insulating member includes at least:
   a first insulating member which comes into abutting contact with the horizontal abutting portion; and
   a second insulating member which comes into abutting contact with the vertical abutting portion.

7. An electric connecting apparatus as claimed in claim 6, wherein
   a step portion including a horizontal wall portion and a vertical wall portion is formed on the housing,
   the horizontal abutting portion of each of the contacts comes into abutting contact with the horizontal wall portion with the first insulating member interposed therebetween, and
   the vertical abutting portion of each of the contacts comes into abutting contact with the vertical wall portion with the second insulating member interposed therebetween.

8. A test system for testing a semiconductor device, comprising:
   an electric connecting apparatus provided with at least a housing to accommodate a plurality of contacts, wherein at least part of the housing is made of a material having high heat conductivity, the plurality of contacts are arranged linearly in at least one row and the plurality of contacts are in abutting contact with the at least part of the housing via at least one insulating member made of an electrically insulative material having high heat conductivity; and
   a printed wiring board including a heat dissipation pad which comes into abutting contact with the housing of the electric connecting apparatus.

9. A test system as claimed in claim 8, wherein
   the insulating member is made of a material having higher heat conductivity than a material of the contacts does.

10. A test system as claimed in claim 8, wherein
    the at least part of the housing is made of metallic materials including at least one of aluminum, an alloy containing aluminum, copper, an alloy containing copper, and stainless steel.

11. A test system as claimed in claim 8, wherein
    the insulating member is made of polycrystalline diamond or ceramics.

12. An electric connecting apparatus, comprising:
    a housing, at least part of which is made of a material having high heat conductivity;
    a plurality of contacts which are arranged linearly in at least one row within the housing; and
    at least one insulating member which is in abutting contact with the plurality of contacts and is made of an electrically insulative material having higher heat conductivity than a material of the contacts does;
    wherein
    a cutout recessed portion including a horizontal contact portion and a vertical contact portion is formed on each of the plurality of contacts,
    at least one of the horizontal abutting portion and the vertical abutting portion comes into abutting contact with the at least one insulating member, and
    the plurality of contacts are in abutting contact with the at least part of the housing via the at least one insulating member.

13. An electric connecting apparatus as claimed in claim 12, wherein
    the at least part of the housing is made of metallic materials including at least one of aluminum, an alloy containing aluminum, copper, an alloy containing copper, and stainless steel.

14. An electric connecting apparatus as claimed in claim 12, wherein
    the insulating member is made of polycrystalline diamond or ceramics.

15. An electric connecting apparatus as claimed in claim 12, wherein
    the insulating member includes at least:
    a first insulating member which comes into abutting contact with the horizontal abutting portion; and
    a second insulating member which comes into abutting contact with the vertical abutting portion.

16. An electric connecting apparatus as claimed in claim 15, wherein
    a step portion including a horizontal wall portion and a vertical wall portion is formed on the housing,
    the horizontal abutting portion of each of the contacts comes into abutting contact with the horizontal wall portion with the first insulating member interposed therebetween, and the vertical abutting portion of each of the contacts comes into abutting contact with the vertical wall portion with the second insulating member interposed therebetween.

17. A test system for testing a semiconductor device, comprising:
an electric connecting apparatus as claimed in claim 12; and
a printed wiring board including a heat dissipation pad which comes into abutting contact with the housing of the electric connecting apparatus.

* * * * *